United States Patent [19]

Schaefer et al.

[11] Patent Number: 5,107,215

[45] Date of Patent: Apr. 21, 1992

[54] RF POWER CALIBRATION FOR AN NMR SCANNER

[75] Inventors: Daniel J. Schaefer, Waukesha; Hammond G. Reynolds; Joseph K. Maier, both of Milwaukee, all of Wis.

[73] Assignee: General Electric, Milwaukee, Wis.

[21] Appl. No.: 543,609

[22] Filed: Jun. 25, 1990

[51] Int. Cl.⁵ .............................................. G01V 3/00
[52] U.S. Cl. .................................... 324/314; 324/313
[58] Field of Search ............... 324/312, 313, 314, 307, 324/309

[56] References Cited

U.S. PATENT DOCUMENTS

| | | | |
|---|---|---|---|
| 4,788,501 | 11/1988 | Leroux et al. | 324/314 |
| 4,799,014 | 1/1989 | Nakabayashi | 324/313 |
| 4,806,866 | 2/1989 | Maier | 324/313 |

Primary Examiner—Hezron E. Williams
Assistant Examiner—Louis M. Arana
Attorney, Agent, or Firm—Quarles & Brady

[57] ABSTRACT

An NMR imaging system includes a prescan procedure in which the RF transmit power level is calibrated to produce an optimal, uniform RF field. Pulse sequences are conducted at a series of RF power levels and from the resulting acquired NMR data the power level which produces the most uniform signal across the extent of the subject being imaged is determined.

4 Claims, 7 Drawing Sheets

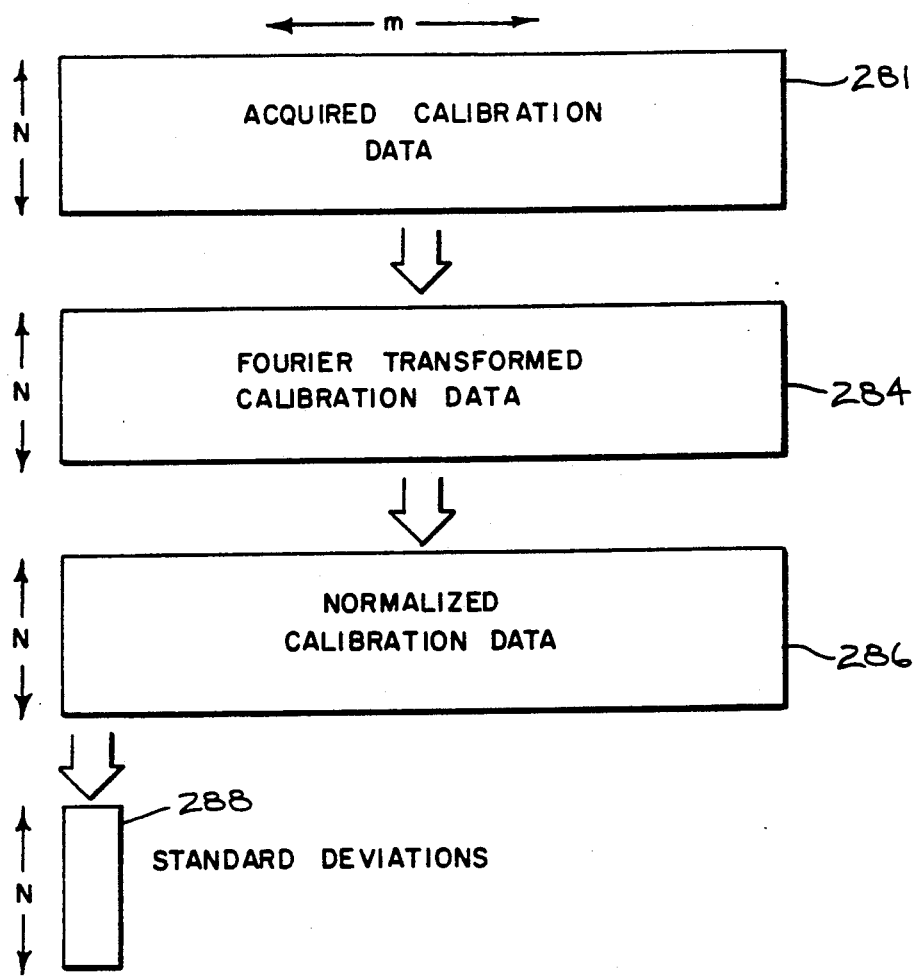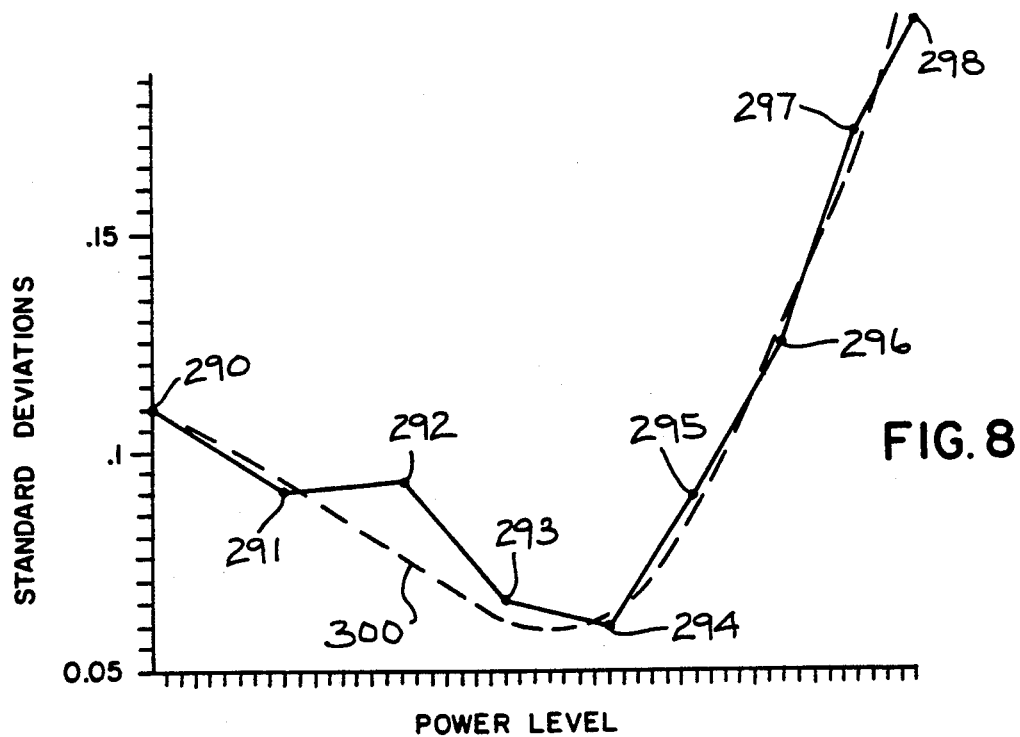

RF POWER CALIBRATION FOR AN NMR SCANNER

BACKGROUND OF THE INVENTION

The field of the invention is nuclear magnetic resonance (NMR) systems and methods and, more particularly, systems for calibrating the RF transmit section of an NMR imaging system.

NMR imaging employs a combination of pulsed magnetic field gradients and pulsed radio frequency fields to obtain NMR imaging information from nuclear spins situated in selected regions of a sample to be imaged. The sample is typically positioned in a static magnetic field effective to polarize nuclear spins having a net magnetic moment so that a greater number of spins align with the polarizing magnetic field and add to produce a net magnetization. The individual polarized nuclear spins, and hence, the net magnetization M, resonate, or precess about an axis of the polarizing magnetic field at a frequency equal to a gyromagnetic constant times the magnitude of the magnetic field. This relationship is known as the Larmor relationship. A gyromagnetic constant exists for each NMR isotope. For a hydrogen nucleus (the most abundant atomic nucleus in a living body), the gyromagnetic constant is about 42.58 MHz/Tesla. With a magnetic field of about 1.5 Tesla, for example, the resulting resonant frequency for hydrogen nuclei predicted by the Larmor relationship is about 63.9 MHz.

In order to obtain a detectable NMR signal, the net magnetization of the nuclear spins is rotated away from coincidence with the axis of the polarizing magnetic field. Rotation is performed using a radio frequency excitation field of the same frequency as that determined by the Larmor relationship. The angle through which the net magnetization is rotated, or "flipped", is related to the field strength of the radio frequency excitation signal and to its duration. At the end of the radio frequency excitation pulse, the nuclei, in relaxing to their normal spin conditions, generate a decaying signal at the same radio frequency as that used for excitation. This NMR signal is picked up by a receive coil, amplified and processed by the NMR system.

As noted above, the angle through which the net magnetization is rotated depends on the radio frequency field strength and duration. NMR imaging generally requires that the net nuclear magnetization be rotated by some specified angle. Rotation to angles varying from these specific angles can produce a variety of problems in the reconstructed image. A full discussion of such problems and one solution therefor is given in U.S. Pat. No. 4,443,760, the disclosure of which is incorporated herein by reference.

Besides adding ghost artifacts to the received signal, errors in radio frequency field strength and pulse duration substantially reduce the amplitude of the received NMR signal. Since the received radio frequency NMR signal is small at best, reduction thereof, with a concomitant degradation in signal-to-noise ratio, is not desirable.

The combination of radio frequency field strength and pulse duration required to produce a particular rotation of net magnetization varies from object to object being imaged. In general, the more massive the body to be imaged, the higher the field strength and/or pulse duration. Also, the required field strength and duration varies with the type of material through which the exciting radio frequency pulse must travel to excite the material being imaged. When the body being imaged is a portion of a human anatomy, for example, the excitation by the radio frequency field varies with patient weight, the portion of the body being imaged, and the proportion of body fat, among other things.

Before the commencement of each NMR scan, it is common practice to adjust the frequency of the RF transmitter and receiver to insure that the RF excitation field is at the optimal Larmor frequency. Such a procedure is disclosed in U.S Pat. No. 4,806,866, which is entitled "Automatic RF Frequency Adjustment For Magnetic Resonance Scanner", and which describes a calibration sequence that automatically determines the best RF transmitter and receiver frequency at the beginning of each NMR scan.

Similarly, before the commencement of each NMR scan, it is common practice to adjust the strength of the transmitted RF excitation field and the gain of the RF receiver so that accurate 90° and 180° flip angles are produced by the RF excitation field pulses. A method for making this adjustment automatically is disclosed in co-pending U.S. patent application Ser. No. 07/907,519 filed on Sept. 15, 1986 and entitled "Automatic Transmit and Receive Attenuation Prescaling In Nuclear Magnetic Resonance Scanner".

While the above described techniques insure that the RF excitation pulses have the optimal frequency, strength and duration to evoke the desired NMR signal, this does not necessarily mean that the expected RF excitation field will be produced uniformly throughout the region of interest, or that the resulting NMR signals will be received uniformly from all locations in the region of interest. Indeed, the RF field produced by most transmit coils as loaded by the subject being studied is not homogeneous and the receive field of most receive coils is similarly not homogeneous. This is particularly true of so-called surface coils which are relatively small coils that are designed to image specific regions of human anatomy. Even if the transmit and receive coil fields are homogeneous, penetration of the RF field into the subject may not be uniform throughout the region of interest and the subject or sample under study may load the coils in a nonuniform manner. Also, mutual inductance between the transmit and receive coils may cause further inhomogeneities in the transmit and receive fields.

Regardless of the reason, the lack of homogeneity in the transmitted or received fields causes undesirable low frequency image intensity shading. This is often manifested in the reconstructed images as dark regions that resemble underexposed photographs or light regions that resemble overexposed photographs.

SUMMARY OF THE INVENTION

The present invention relates to a method for calibrating the RF transmit power on an NMR imaging system such that the most homogeneous RF excitation field possible is produced across the selected slice to be imaged. More particularly, the calibration method of the present invention includes: performing a series of N NMR pulse sequences at differing RF excitation power levels; acquiring a corresponding set of N NMR signals by sampling each NMR signal at intervals and digitizing the samples to produce a row of m data points for each NMR signal in the set; Fourier transforming each row of m data points in the set to produce an array of transformed data points having N rows and m columns; normalizing the transformed data points by dividing the transformed data points in each column of the array by the largest data point in the column; calculating the standard deviation for each row of normalized data points; and calculating an optimal RF excitation power level based on the calculated standard deviations.

A general object of the invention is to improve the uniformity of the NMR intensity level across the entire slice being imaged. Rather than select an RF excitation power level which produces the maximum NMR signal across the slice being imaged, the present invention selects the power level which produces the most uniform NMR signal strength across the slice. This reduces the shading that is produced in the NMR image due to non-uniformity of the RF excitation field.

Another object of the invention is to provide a method for calibrating the RF excitation power prior to each scan of a patient. The method of the present invention is part of a prescan sequence in which the calibration data is acquired from the same slice that is to be imaged. The data acquisition and computations may, for example, require 30 seconds at the beginning of each scan, and the RF excitation power level is automatically adjusted to produce an optimal image for the particular conditions that exist during the subsequent scan.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 6 is a pictoral representation of data structures associated with the prescan program of FIG. 5;

FIG. 8 is a graphic representation of the curve fitting step which is employed by the prescan program of FIG. 5.

DESCRIPTION OF THE PREFERRED EMBODIMENT

Figure 1:
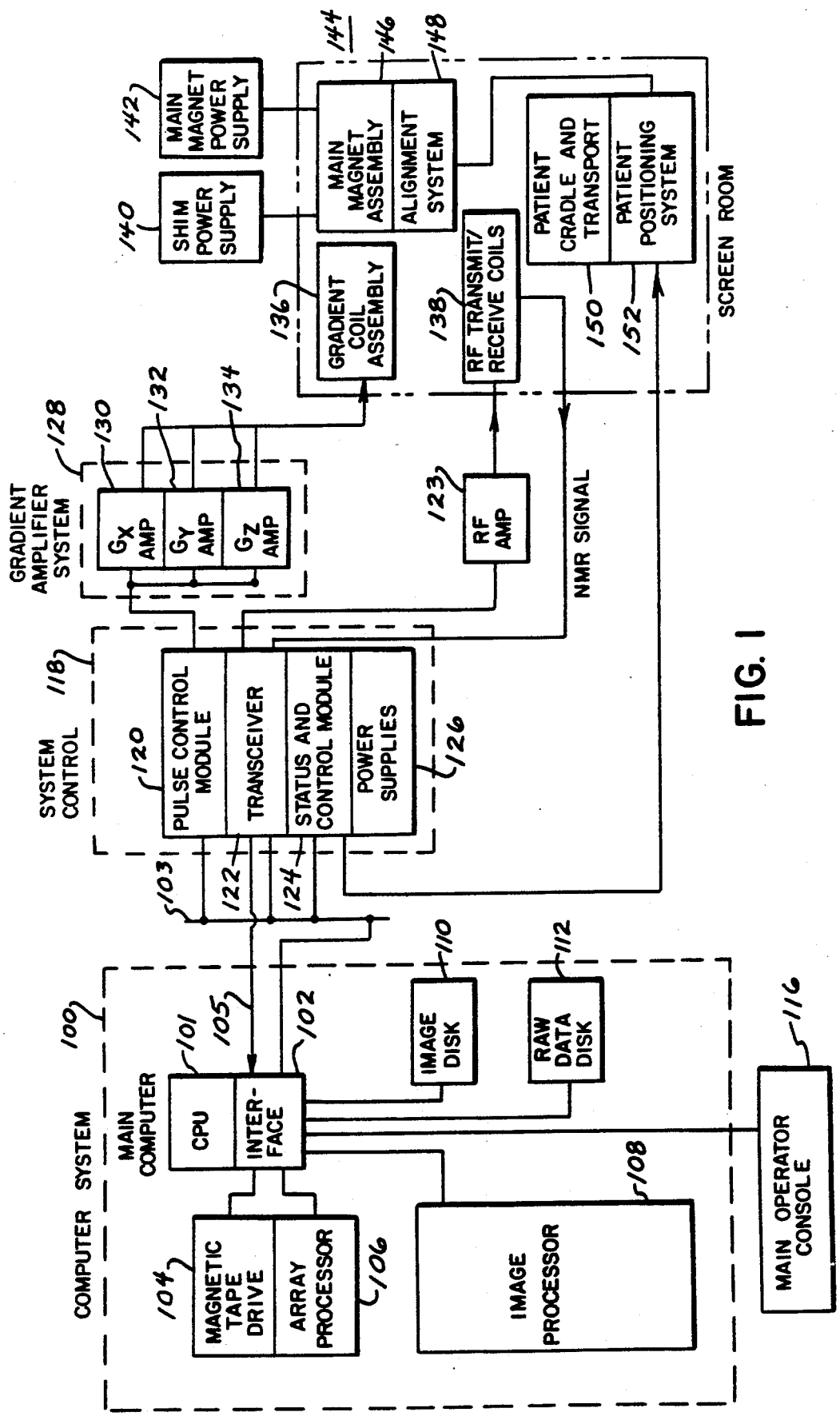
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV4000). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. An array processor 106 is utilized for preprocessing data and for image reconstruction. The function of image processor 108 is to provide interactive image display manipulation such as magnification, image comparison, gray-scale adjustment and realtime data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system exercises control over the NMR system by means of system control 118 and gradient amplifier system 128. The computer 100 communicates with system control 118 by means of a serial digital communication network 103 (such as the Ethernet network) in a manner well known to those skilled in the art. The system control 118 includes several subsystems such as the pulse control module (PCM) 120, a radio frequency transceiver 122, a status control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 and which is part of a magnet assembly 146. When energized, the gradient coils generate magnetic field gradients $G_x$, $G_y$ and $G_z$ of the magnetic field in the same direction as the main polarizing magnetic field. The gradients are directed in mutually orthogonal X-, Y- and Z-axis directions of a Cartesian coordinate system. That is, if the magnetic field generated by the main magnet (not shown) is directed in the z direction and is termed $B_o$, and the total magnetic field in the z direction is referred to as $B_z$, then $G_x = \partial B_z / \partial x$, $G_y = \partial B_z / \partial y$ and $G_z = \partial B_z / \partial z$, and the magnetic field at any point (x, y, z) is given by $B(x, y, z) = B_o + G_x \cdot X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform module in accordance with the control signals to an RF power amplifier 123 which then energizes RF coils 138 which are situated within main magnet assembly 146. The NMR signals radiated by the excited nuclei in the patient are sensed by the same or a different RF coil than issued for transmitting. The signals are detected, amplified, demodulated, filtered, and digitized in the receiver section of the transceiver 122. The processed signals are transmitted to the main computer 101 for processing by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as an Intel 8086) for processing commands from the main computer 101. The SCM 124 includes means for acquiring information regarding patient cradle position, and the position of the movable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The shim power supply 140 is utilized to energize shim coils associated with the main magnet and which are used to correct inhomogeneities in the polarizing magnetic field. In the case of a resistive magnet, main magnet power supply 142 is utilized to continuously energize the magnet. In the case of a superconductive magnet, the main magnet power supply 142 is utilized to bring the polarizing field produced by the magnet to the proper operating strength and is then disconnected. In the case of a permanent magnet, power supply 142 would not be needed.

The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room. A bi-directional attenuation of approximately 100 db. is typical in the 63 MHz to 64 MHz frequency range of operation.

Figure 2:
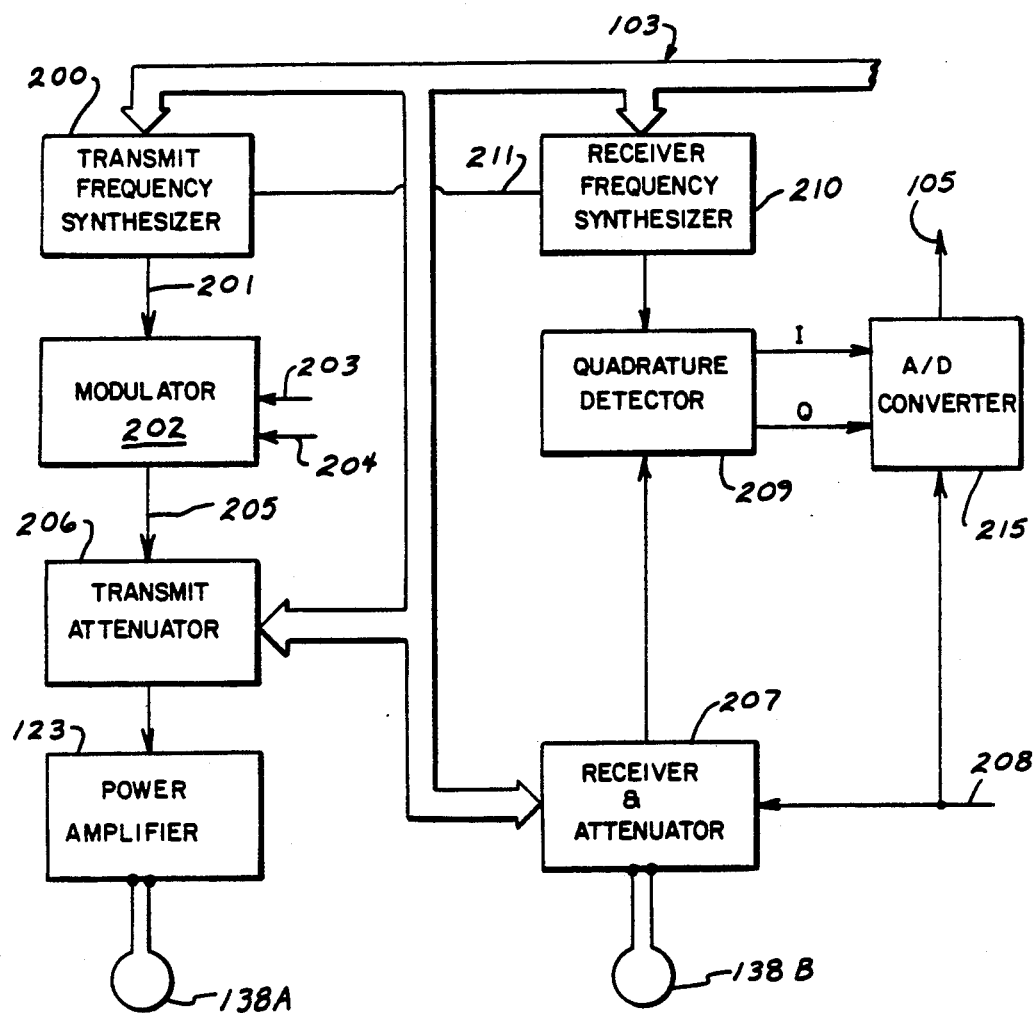
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals (CF) through the communications link 103 from the main computer 101. These digital signals indicate the frequency which is to be produced at an output 201 at a resolution of one Hertz. The commanded RF carrier is applied to a modulator 202 where it is frequency and amplitude modulated in response to signals received through line 203, and the resulting RF excitation signal is turned on and off in response to a control signal from the PCM 120 received through line 204. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. The present invention pertains to the determination of the value of this transmit attenuation signal (TA), and will be described in detail below.

Referring still to FIGS. 1 and 2, the NMR signal produced by the subject is picked up by the receiver coil 138B and applied to the input of a receiver 207. The receiver 207 amplifies the NMR signal and this is then attenuated by an amount determined by a digital attenuation signal (RA) received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through filters to a pair of analog-to-digital converters indicated collectively at 215. These A/D converters are enabled by the control line 208 to produce digitized NMR data only when a valid signal is present. This data is output to the main computer 101 through line 105. The filters at the inputs to the A/D converters are controlled by the main computer 101 to limit the bandwidth of I and Q. The quadrature detector 209 also receives an RF reference signal from a second frequency synthesizer 210. The frequency synthesizer 210 receives digital signals (CF) through the link 103 which determine the frequency of the demodulation signal. The phase of the two synthesizers 200 and 210 is locked together through a line 211, and in most measurements, the frequency of the two synthesizers is the same.

Figure 3:
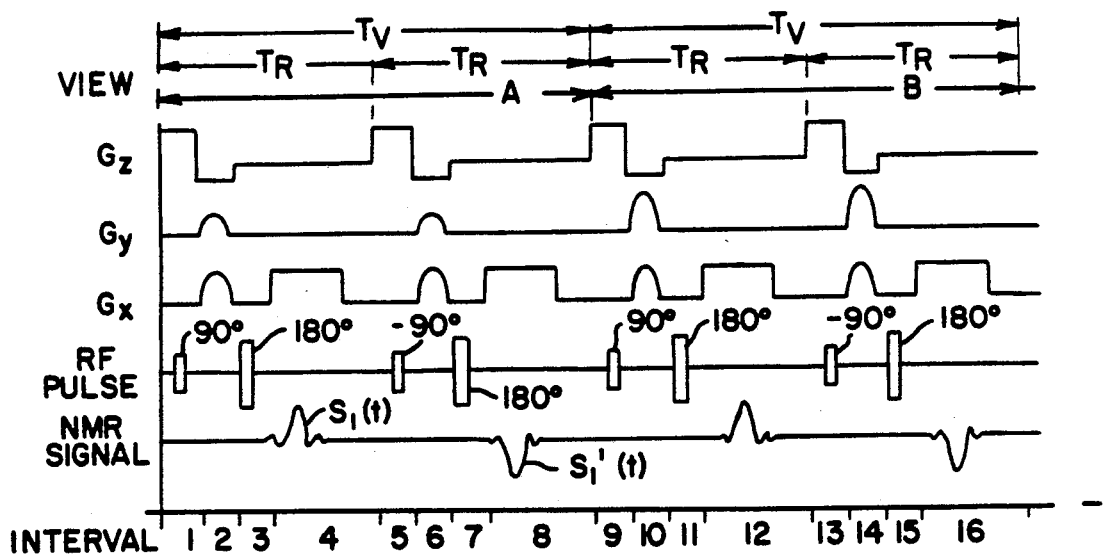
FIG. 3 is a graphic representation of a pulse sequence which may be employed to practice the present invention.

Referring to FIG. 3, two views are shown of a conventional imaging pulse sequence of the type known as two dimensional Fourier transforms (2DFT), and which is also referred to as two-dimensional "spin-warp". This pulse sequence is useful in obtaining, in a well known manner, imaging NMR data to reconstruct images of an object being investigated. The two views are indicated at "A" and "B" and they are identical with the exception of the phase encoding gradient field $G_y$. Each view is a pulse sequence which utilizes phase-alternated RF excitation pulses which, as disclosed and claimed in U.S. Pat. No. 4,443,760, produce phase-alternated NMR signals $S_1(t)$ and $S_1'(t)$ to cancel certain baseline errors in the NMR system.

As shown in FIG. 3 at interval 1 (indicated along the horizontal axis), a selective 90° RF excitation pulse is applied in the presence of a positive $G_z$ magnetic field gradient pulse. Pulse control module 120 (FIG. 1) provides the needed control signals to the $G_z$ gradient amplifier 134 and to the frequency synthesizer 200 and modulator 202 (FIG. 2) so that the resulting gradient field and excitation pulse excites nuclear spins only in a predetermined slice of the object being imaged. Typically, the excitation pulse is amplitude modulated by a (sin x)/x function. The frequency of the synthesizer 200 is dependent on the strength of the applied polarizing magnetic field and the particular NMR species being imaged in accordance with the well known Larmor equation. The strength of the slice select $G_z$ gradient determines the physical location of the slice through the patient from which imaging NMR data will be acquired.

Continuing with reference to FIG. 3, $G_x$, $G_y$ and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the $G_z$ gradient waveform over interval 1. The function of the negative $G_z$ pulse is to rephase the nuclear spins excited in interval 1. The $G_y$ gradient pulse is a phase encoding pulse selected to have a different amplitude in each of Views A, B, . . . , etc., to encode spatial information in the direction of the gradient. The number of different $G_y$ gradient amplitudes is typically selected to equal at least the number of pixel resolution elements which the reconstructed image will have in the phase encoding (Y) direction. Typically, 128, 256 or 512 different gradient amplitudes $G_y$ are employed in a complete NMR scan, and in the typical NMR system the $G_y$ values are incremented a fixed amount from one view to the next until the NMR scan is complete. This phase encoding gradient is turned off during the prescan sequence as will be described below.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin-echo NMR signal is produced typically by the application of a 180° RF pulse in interval 3. As is known, the 180° RF pulse is a pulse which reverses the direction of system induced dephasing (i.e. nonchemical dephasing) so as to produce the spin-echo signal. While not shown in FIG. 3, the 180° RF pulse is selective and is preferably produced in the presence of a slice select gradient $G_z$ to reverse direction of the spins in the same slice as that excited by the 90° RF pulse. The spin-echo NMR signal is sampled in interval 4 in the presence of a readout gradient pulse $G_x$ to frequency encode spatial information in the direction (X) of this readout gradient.

As indicated above, baseline error components can be eliminated by using an additional NMR measurement in each view. This second measurement is substantially identical to the first with the exception that the RF excitation pulse in interval 5 of View A is selected to be 180° out of phase (as suggested by the minus sign) relative to the excitation pulse in interval 1 of View A. As a result, the spin-echo NMR signal $S_1'(t)$ in interval 8 is 180° out of phase with the spin-echo signal $S_1(t)$ in interval 4. If the signal $S_1'(t)$ is subtracted from $S_1(t)$, only those components of the signals with reversed sign in the signal $S_1'(t)$ are retained. The baseline error components thus cancel. The pulse sequence of FIG. 3 is repeated for View B, C, D, and so on, for all values of the phase encoding gradient $G_y$.

Figure 4:
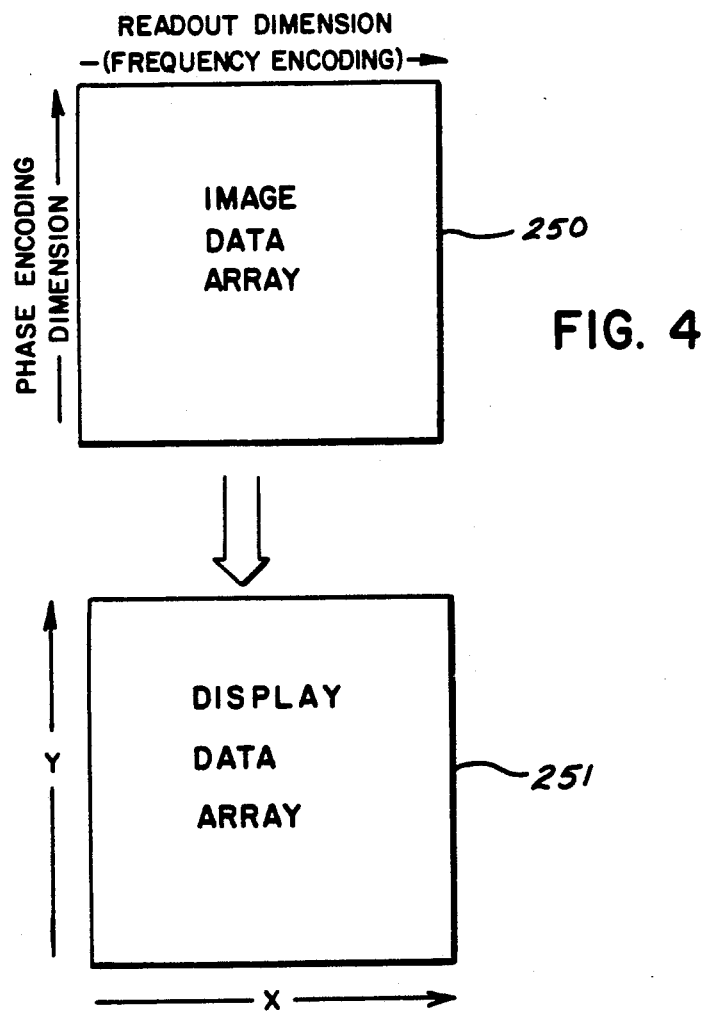
FIG. 4 is a pictorial representation of the data produced by the NMR system of FIG. 1.

Referring particularly to FIG. 4, the resulting acquired NMR data is stored in digital form in an image data array 250. The image data array 250 is a two-dimensional array which stores each sampled and digitized NMR signal as a series of elements along a row of the array (the readout dimension). Each such row of data is associated with a particular View and these are arranged in order along the other dimension of the array, the phase encoding dimension. As is well known in the art, a two-dimensional Fourier transformation is then performed on the image data array 250 to produce a two-dimensional display data array 251. The display data array 251 may be mapped to a CRT, for example, to control the brightness of each pixel on its screen. Each element of the display data array 251 indicates by its intensity, the level of the received NMR signal at a corresponding x, y location in the slice being imaged. These intensity values in turn control the brightness of corresponding pixels on the CRT screen to produce an image.

It can be appreciated by those skilled in the art that the above description of the processing is a simplification. In fact, the image data array 250 exists as two arrays, one for the in phase, or I values, of the acquired NMR signals, and one for the quadrature, or Q values. The Fourier transformations are performed on these complex values and the display data array 251 is produced by calculating the square root of the sum of the squares of corresponding elements in the resulting transformed arrays. It can also be appreciated that many other NMR pulse sequences and processing methods may be employed to produce the display data array 251, and that the present invention is applicable to all of them.

For the proper operation of the above described NMR system, it is necessary that the transmit coil 138A (FIG. 2) produce a uniform, or homogeneous, RF excitation field of the proper strength and duration throughout the entire region of interest. To the extent that this is not the case, the net magnetization of the nuclear spins at different locations in the excited slice will not be tipped at the desired 90° and 180° indicated by the pulse sequence of FIG. 3. Consequently, the NMR signal produced at such locations will not have the proper amplitude and the corresponding locations in the display data array 251 (FIG. 4) will have incorrect intensity values. In the pulse sequence of the preferred embodiment, this results in regions of the display data array 251 with lower intensity values. These lower intensity values produce undesirable dark shading in the displayed image.

Even if the RF excitation field is produced homogeneously throughout the region of interest with an unloaded coil 138A, this does not insure that all the nuclear spins "see" the same field, or that the receive coil 138B receives the resulting NMR signals uniformly throughout the region of interest. For example, the loading effects of the patient may distort the otherwise homogeneous RF excitation field of the unloaded coil 138A, or the receive field of the receive coil 138B may not be homogeneous. The result again is distortion of the intensity values in the display data array 251 with consequent shading effects in the displayed image.

The present invention is a procedure for determining the value of the transmit attenuation signal (TA) which determines the magnitude of the RF excitation signal produced by the scanner system. This procedure is performed under the direction of a prescan program which is executed by the CPU 101 at the beginning of each scan of a patient. The output of this procedure is a value for TA which will produce the most uniform, or homogeneous, RF field possible under the given measurement conditions. The image which is then produced during the scan will suffer from minimal shading effects.

Figure 5:
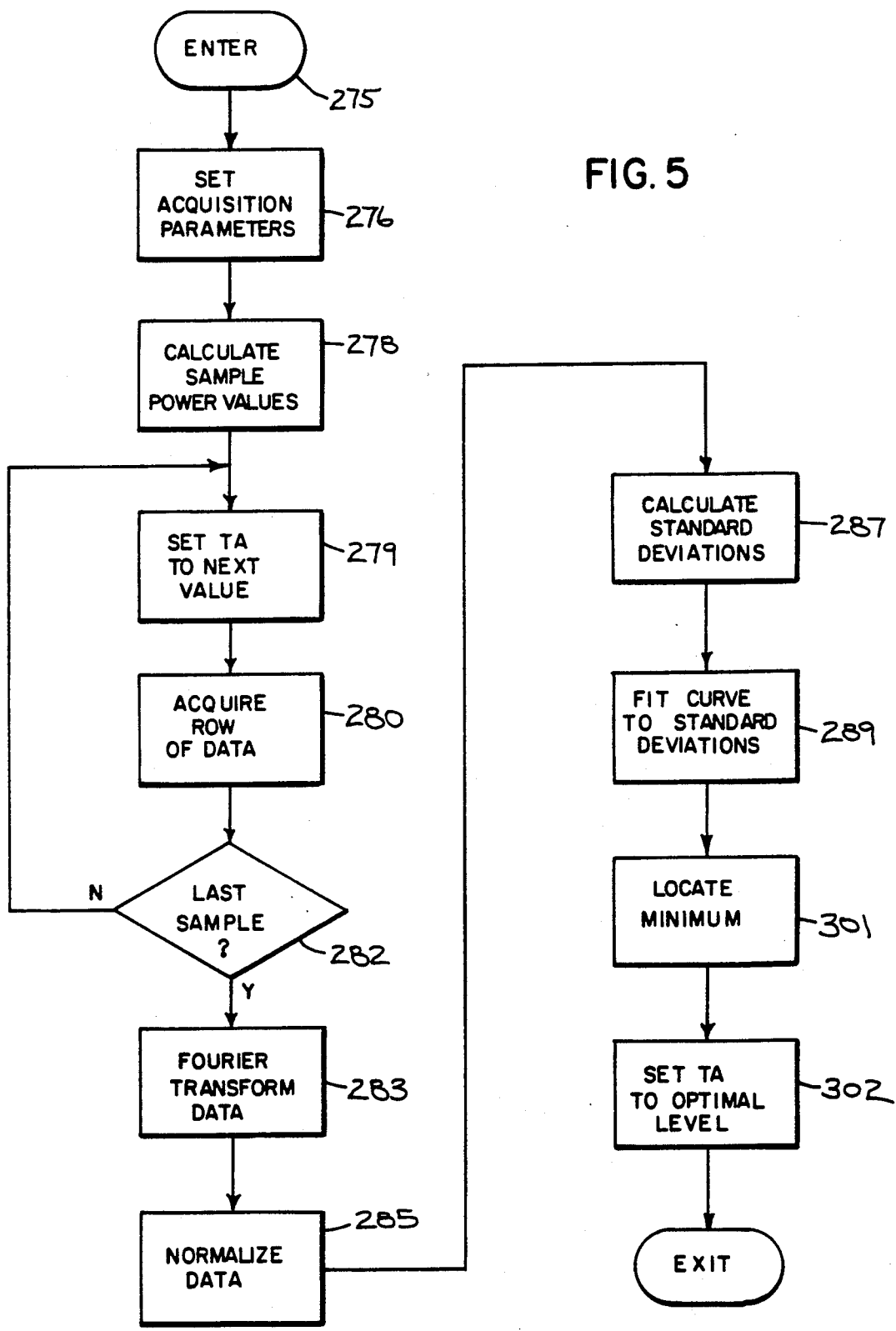
FIG. 5 is a flowchart of the prescan program which is executed by the NMR system of FIG. 1 to perform the present invention.

Referring particularly to FIG. 5, the program is entered at 275 and the acquisition parameters are input and set as indicated at process block 276. These parameters relate primarily to the specifics of the pulse sequence which is to be used in the NMR scan, and they include for the particular pulse sequence of FIG. 3:

TE=5 to 30 milliseconds;
TR=2,000 milliseconds;
Number of slices=1 to 24;
Slice thickness=5 to 10 millimeters;
Slice spacing=10 millimeters or more;
Field of view=32 to 48 centimeters; and
Image array size, x=256 (readout direction), y=128 (phase encoding direction) to 192.

As indicated at process block 278, a set of N sample transmit attenuation values (TA$_1$ through TA$_N$) are then calculated. Nine sample values are employed in the preferred embodiment with the fifth, or center, sample value being TA$_{nom}$ and the remaining eight samples being taken at equal intervals over a linear flip angle range which is symmetric about this central, $\theta=90°$, nominal sample. For example, the values of sample attenuation values TA$_1$ through TA$_9$ are selected to produce flip angles ($\theta$) of 70°, 75, 80°, 85°, 90°, 95°, 100°, 105° and 110°, respectively. The value of TA$_{nom}$ is determined in any of the well known ways currently in use, such as the procedure described in the above-cited copending application Ser. No. 907,519.

After the nine sample transmit attenuation values have been determined, a loop is entered in which an NMR measurement is performed with each sample transmit value TA$_1$ through TA$_N$. As indicated at process block 279, the next sample transmit attenuation value is output to the transmit attenuation 206 (FIG. 2), and an NMR measurement pulse sequence is executed, as indicated at process block 280. The NMR measurement pulse sequence is the pulse sequence of intervals 1 through 8 of FIG. 3 with G$_y$ turned off so that a row of data indicative of the profile of the subject is acquired. This NMR data is acquired as 256 samples that are each digitized and stored in one row of an N=9 by m=256 storage array 281 (FIG. 6). This measurement and data acquisition is repeated for each value of TA to fill up the N by m array 281. The loop is then exited at decision block 282 to begin processing the acquired calibration data.

Figure 7A:
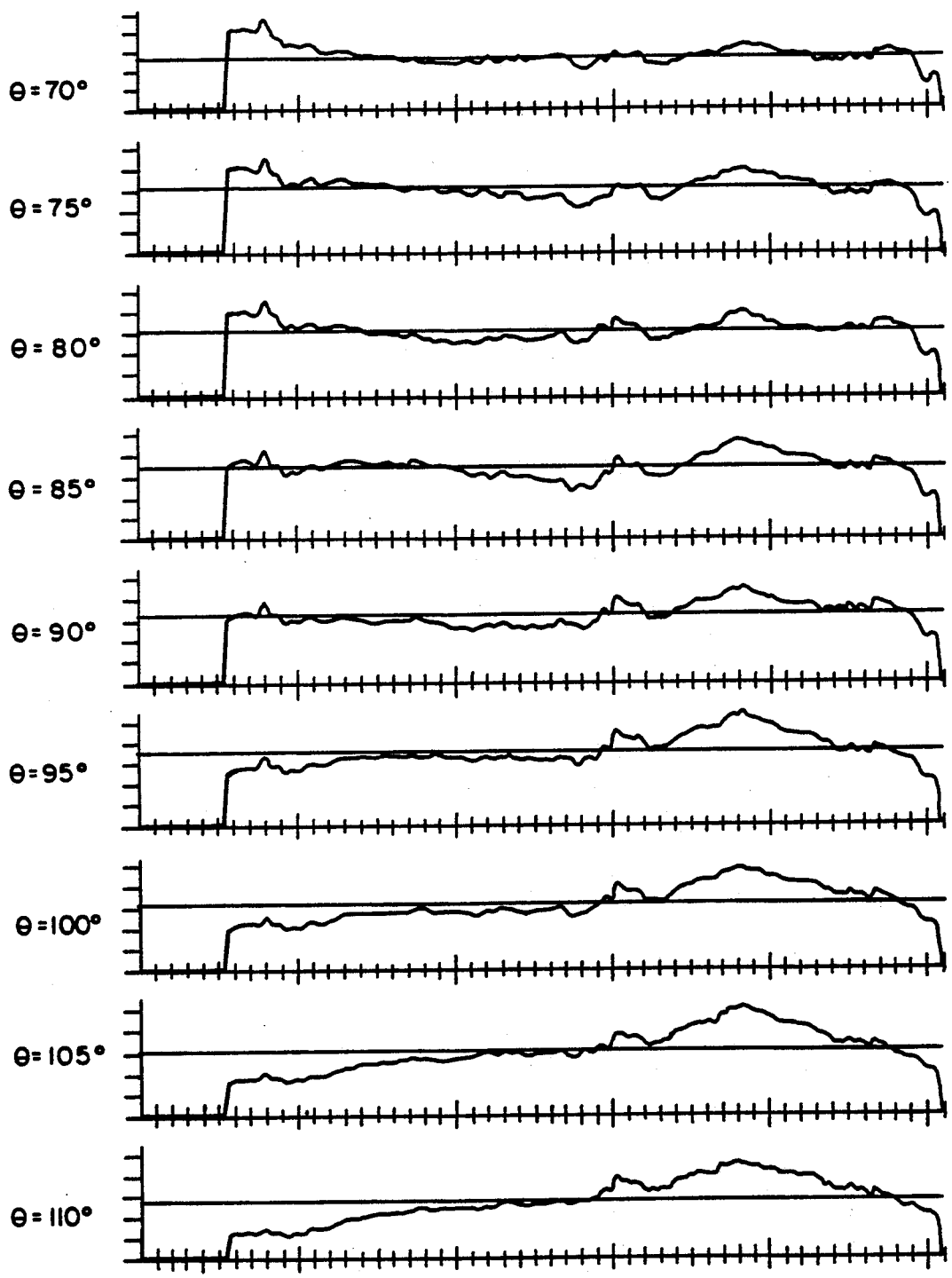
FIGS. 7A and 7B are graphic representations of the data contained in the data structures of FIG. 6.

Referring still to FIG. 5, the first step in the processing is to perform a one-dimensional Fourier transformation on each row of the acquired data in the array 281 as indicated at process block 283. Since the acquired NMR data is in fact a set of complex numbers (I and Q values for each sample), the transformation is a complex Fourier transformation and the transformed I and Q values are converted to intensity values by taking the square root of the sum of their squares. As a result, an array of Fourier transformed calibration data 284 (FIG. 6) is produced. The array 284 has N rows (one for each sample TA) of m intensity values, with each row indicating the intensity of the acquired NMR signal in the selected slice and along the direction (x) of the read out gradient (G$_x$). An example of such calibration data is shown in FIG. 7A, where the vertical axes are signal intensity and where the horizontal axes are position in the read out direction (x).

Figure 7B:
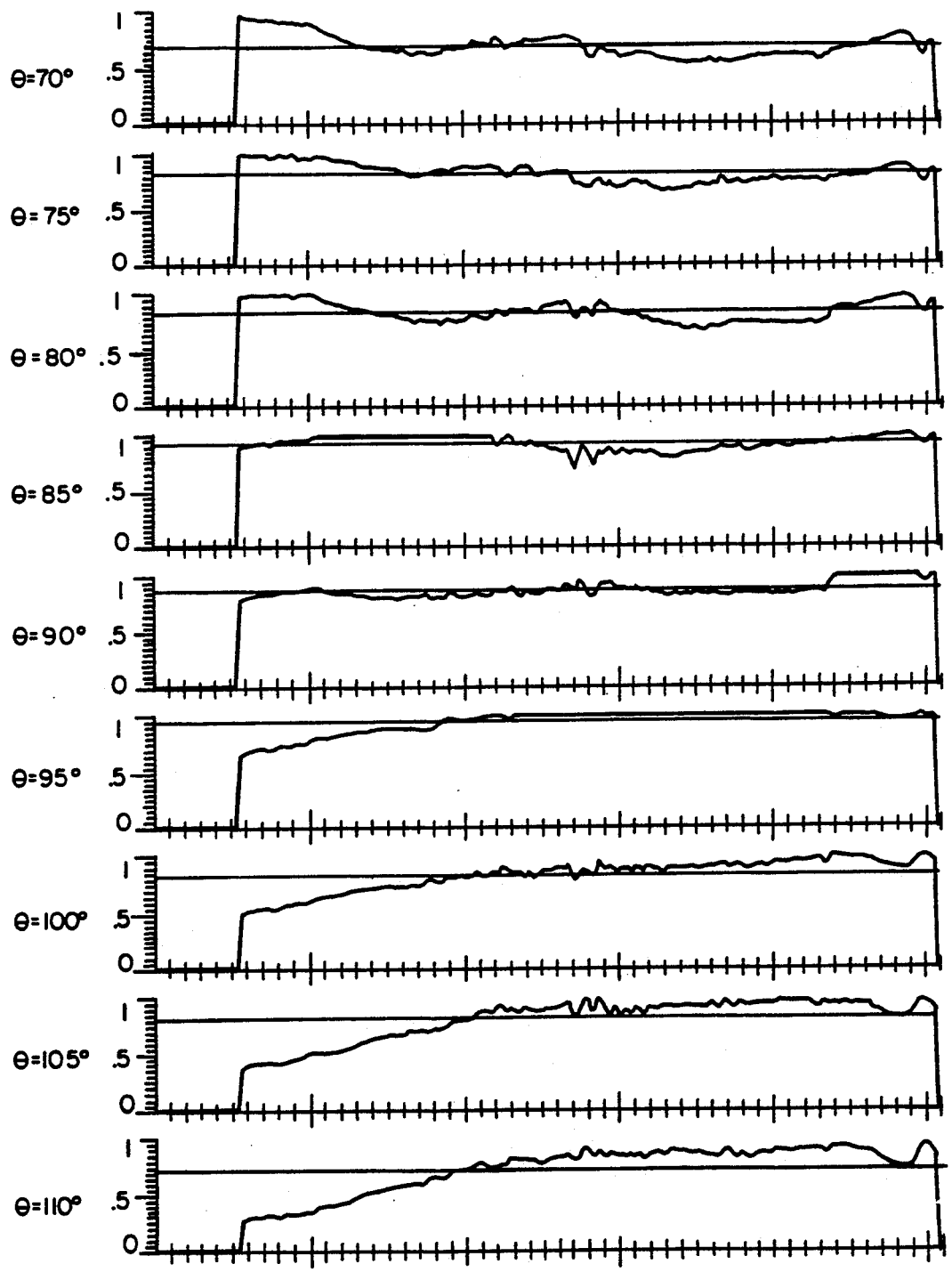

Referring again to FIG. 5, the next step in the procedure is to normalize the data in the array 284 as indicated by process block 285. This is performed on a column-by-column basis and includes selecting the largest intensity value in each column of the array 284, and then dividing each intensity value in a column by that column's largest value. The resulting normalized values are stored in an N by m array 286 (FIG. 6). A plot of the normalized values in each row of the array 286 is shown in FIG. 7B. From this normalized calibration data it can be observed that the signal intensity across the entire profile is most uniform for some attenuation value TA which lies between those used to produce the $\theta=90°$ and $\theta=85°$ profiles. Note that the normalized profile for $\theta=95°$ is very uniform over a large area, but that it dips considerably on the left side. Such a dip indicates that an image produced with this level of transmit attenuation would be shaded on the left side of the image. Note also, that the normalized profile corresponding to $\theta=90°$ is raised on the right end and that this would produce some increase in brightness on the right side of the image. It is obvious from these curves that no power setting will produce a perfectly uniform RF field and that the objective of the present invention is to select the optimal power level.

As shown by process block 287 in FIG. 5, to select the optimal power level the next step in the procedure is to calculate the standard deviation of the normalized calibration data in each row of the array 286 (FIG. 6).

$$S_n = \left[ \sum_{i=1}^{m} (I_i - \bar{I})^2/(m-1) \right]^{\frac{1}{2}}$$

where
$I_i$=normalized calibration values in the row N
$\bar{I}$=average of the normalized calibration values in the row N.

The resulting N=9 standard deviation values are stored in an array 288 (FIG. 6).

The next step is to find the second order curve which best fits these nine standard deviation values as indicated in FIG. 5 by process block 289. Such a curve fitting procedure is described in Chapter 8 of a book by Philip R. Bevington entitled *Data Reduction and Error Analysis For the Physical Sciences*, published in 1969 by McGraw-Hill Book Company. Such a curve is illustrated in FIG. 8, where points 290-298 are the nine standard deviation values from the array 288 and the horizontal axis is the power used to produce them. Once the best curve has been fit to the standard deviation values as indicated by dashed line 300, the location of the minimum in this curve is found by determining where its derivative is zero. This is accomplished at process block 301 in FIG. 5, and the coordinate of this point is determined and output as the optimal transmit attenuation value (TA) for producing a $\theta=90°$ tip angle, as indicated at process block 302. The prescan is then exited and the scan sequence is executed to acquire NMR data from which an image can be reconstructed.

Where the scan acquires NMR data from multiple slices, it is preferable to calculate an optimal transmit attenuation value for each slice. In such case, the above prescan procedure is repeated for each slice that is to be imaged. The only difference in each cycle of the procedure is that either the frequency of the RF excitation pulses or the magnitude of the slice select gradient G$_z$ is changed so that the calibration data is acquired from each slice that is to be imaged in the subsequent scan. The set of optimal transmit attenuation values that are produced are stored and are output to the transmit attenuator 206 as needed during the multi-slice scan.

We claim:

1. A method for calibrating the RF transmit power on an NMR system, the steps comprising:

performing a series of N NMR pulse sequences with the NMR system RF transmit power set at a different power level during each pulse sequence;

acquiring a set of NMR calibration data by sampling an NMR signal produced by each of the N NMR pulse sequences to produce N rows of m data points;

Fourier transforming each row of m data points in the calibration data set to produce an array of transformed data points having N rows and m columns;

normalizing the transformed data points by dividing the transformed data points in each column of the array by the value of the largest data point in the column;

calculating the standard deviation for each row of normalized data points in the array; and calculating an optimal RF transmit power based on the values of the calculated standard deviations.

2. The method as recited in claims 1 in which the optimal RF transmit power is calculated by fitting a curve to the calculated standard deviations and determining the RF transmit power which corresponds to the point at which the curve is at a minimum.

3. The method as recited in claim 1 in which each of the N NMR pulse sequences includes a selective RF excitation pulse and a magnetic field gradient pulse which selects a slice from which the NMR signals are produced.

4. The method as recited in claim 3 in which a plurality of optimal RF transmit power levels are calculated for a corresponding plurality of slices to be imaged, and each optimal RF transmit power level is determined using an NMR pulse sequence having a selective RF exciation pulse and a magnetic field gradient pulse which selects its corresponding slice.

* * * * *